(12) United States Patent
Tsai et al.

(10) Patent No.: US 9,076,715 B2
(45) Date of Patent: Jul. 7, 2015

(54) INTERCONNECT STRUCTURE FOR CONNECTING DIES AND METHODS OF FORMING THE SAME

(71) Applicant: Taiwan Semiconductor Manufacturing Company, Ltd., Hsin-Chu (TW)

(72) Inventors: Shu-Ting Tsai, Kaohsiung (TW); Dun-Nian Yaung, Taipei (TW); Jen-Cheng Liu, Hsinchu (TW); Shih Pei Chou, Tainan (TW); U-Ting Chen, Wanluan Township (TW); Chia-Chieh Lin, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/090,831

(22) Filed: Nov. 26, 2013

(65) Prior Publication Data

US 2014/0264709 A1    Sep. 18, 2014

Related U.S. Application Data

(63) Continuation-in-part of application No. 13/839,860, filed on Mar. 15, 2013.

(60) Provisional application No. 61/777,870, filed on Mar. 12, 2013.

(51) Int. Cl.
| | |
|---|---|
| *H01L 23/48* | (2006.01) |
| *H01L 25/16* | (2006.01) |

(Continued)

(52) U.S. Cl.
CPC ........ *H01L 25/167* (2013.01); *H01L 21/76879* (2013.01); *H01L 23/5226* (2013.01); *H01L 24/95* (2013.01); *H01L 27/0688* (2013.01); *H01L 27/281* (2013.01); *H01L 21/76807* (2013.01); *H01L 23/481* (2013.01);

(Continued)

(58) Field of Classification Search
CPC .............. H01L 27/281; H01L 27/0688; H01L 21/76807; H01L 21/76898
USPC .................................. 257/773, 774; 438/622
See application file for complete search history.

(56) References Cited

U.S. PATENT DOCUMENTS

| | | |
|---|---|---|
| 7,642,173 B2 | 1/2010 | McDonald |
| 8,358,008 B2 | 1/2013 | Wada et al. |

(Continued)

FOREIGN PATENT DOCUMENTS

JP    2010114165    5/2010

*Primary Examiner* — David Vu
*Assistant Examiner* — Brandon Fox
(74) *Attorney, Agent, or Firm* — Slater & Matsil, L.L.P.

(57) ABSTRACT

A structure includes a first chip having a first substrate, and first dielectric layers underlying the first substrate, with a first metal pad in the first dielectric layers. A second chip includes a second substrate, second dielectric layers over the second substrate and bonded to the first dielectric layers, and a second metal pad in the second dielectric layers. A conductive plug includes a first portion extending from a top surface of the first substrate to a top surface of the first metal pad, and a second portion extending from the top surface of the first metal pad to a top surface of the second metal pad. An edge of the second portion is in physical contact with a sidewall of the first metal pad. A dielectric layer spaces the first portion of the conductive plug from the first plurality of dielectric layers.

20 Claims, 15 Drawing Sheets

(51) Int. Cl.
*H01L 21/768* (2006.01)
*H01L 23/522* (2006.01)
*H01L 23/00* (2006.01)
*H01L 27/06* (2006.01)
*H01L 27/28* (2006.01)
*H01L 25/065* (2006.01)
*H01L 27/146* (2006.01)

(52) U.S. Cl.
CPC ...... *H01L25/0657* (2013.01); *H01L 27/14634* (2013.01); *H01L 27/1469* (2013.01)

(56) References Cited

U.S. PATENT DOCUMENTS

| | | | |
|---|---|---|---|
| 8,421,193 | B2 | 4/2013 | Huang |
| 2011/0171582 | A1* | 7/2011 | Farooq et al. .................. 430/314 |
| 2013/0093098 | A1 | 4/2013 | Yang et al. |
| 2014/0264862 | A1 | 9/2014 | Tsai et al. |

* cited by examiner

INTERCONNECT STRUCTURE FOR CONNECTING DIES AND METHODS OF FORMING THE SAME

CROSS REFERENCES

This application claims the benefit of U.S. Provisional Application Ser. No. 61/777,870, filed on Mar. 12, 2013, entitled "Interconnect Structure and Method," and is a continuation-in-part application of the U.S. patent application Ser. No. 13/839,860, filed on Mar. 15, 2013, entitled "Interconnect Structure and Method," which applications are hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrink the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An interconnect structure interconnecting two stacked dies and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
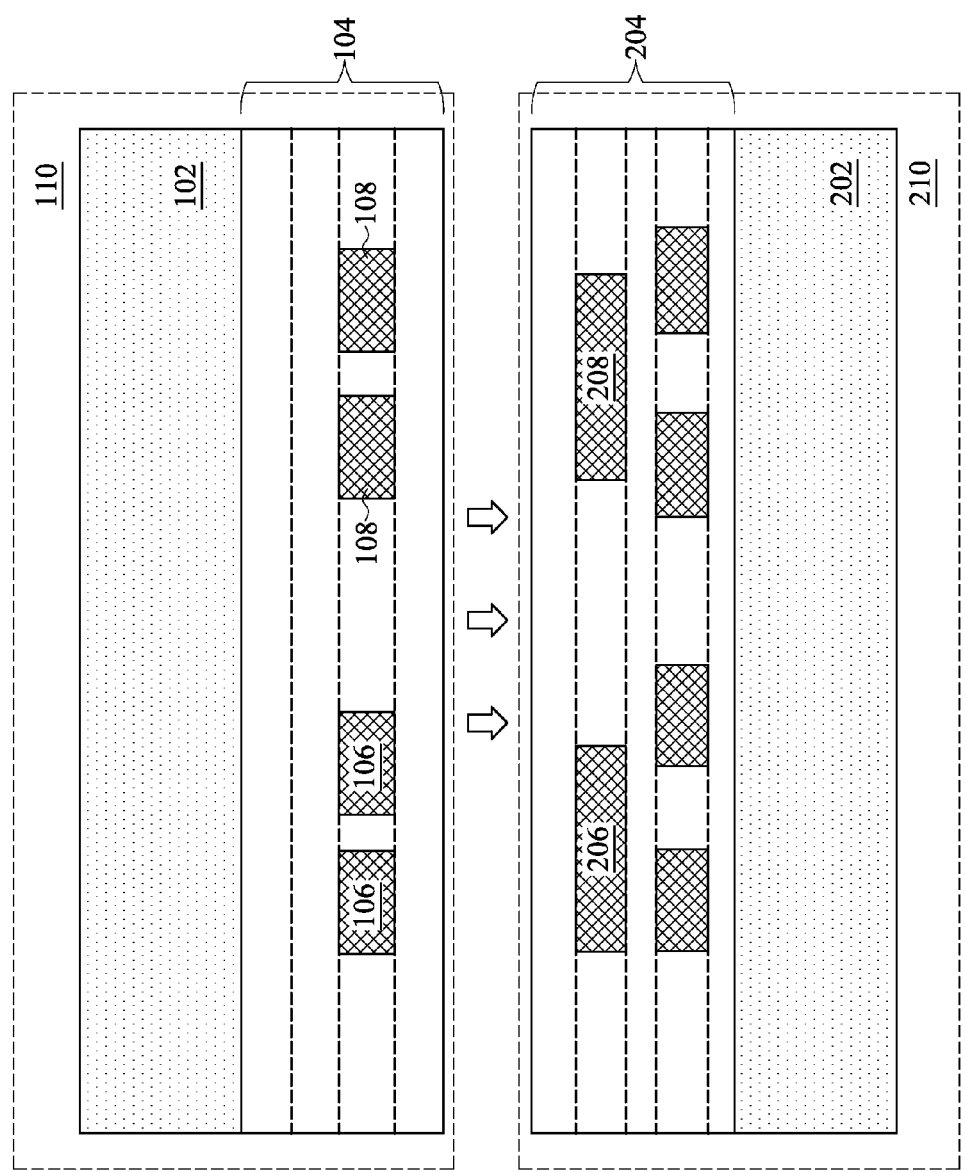
FIGS. 1 through 11 illustrate the cross-sectional views of intermediate stages in the formation of an interconnect structure connecting two dies in accordance with some exemplary embodiments.

FIG. 1 illustrates a cross-sectional view of a stacked semiconductor device prior to a bonding process in accordance with various embodiments of the present disclosure. Both the first semiconductor wafer 110 and the second semiconductor wafer 210 include a semiconductor substrate (e.g., first substrate 102 and second substrate 202) and a plurality of interconnect structures (e.g., metal pads 106, 108, 206, and 208) formed over the semiconductor substrate. The first semiconductor wafer 110 is used as an example to illustrate the detailed structure of the semiconductor wafers prior to a bonding process. In subsequent discussions, the details are discussed referring to metal pad 106. The same process that is performed on metal pad 106 is also performed on metal pad 108.

As shown in FIG. 1, the first semiconductor wafer 110 may comprises a first substrate 102 and a plurality of inter-metal dielectric layers 104 formed underlying the first substrate 102. In addition, a plurality of metal lines (not shown) is formed in each of the dielectric layers 104, with metal vias and contact plugs (not shown) interconnecting the plurality of metal lines. In accordance with some embodiments, metal pad 106 is formed in the inter-metal dielectric layers 104. Although FIG. 1 illustrates that metal pad 106 is formed in an intermediate layer of dielectric layers 104, metal pad 106 may be in any of dielectric layers 104.

The first substrate 102 may be formed of silicon, although it may also be formed of other group III, group IV, and/or group V elements, such as silicon, germanium, gallium, arsenic, and combinations thereof. In addition, other substrates that may be used include multi-layered substrates, gradient substrates, hybrid orientation substrates, any combinations thereof and/or the like.

The first substrate 102 may further comprise a variety of electrical circuits (not shown). The electrical circuits formed on the first substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The metal pad 106 may be made through any suitable formation process (e.g., lithography with etching, damascene, dual damascene, or the like) and may be formed using suitable conductive materials such as copper, aluminum, aluminum alloys, copper alloys or the like. FIG. 15A through illustrate some exemplary top views of metal pad 106, which show metal pad 106 form a ring, with an opening in metal pad 106. Hence, the illustrated two portions (FIG. 1) of metal pad 106 are portions of an integrated metal pad.

As shown in FIG. 1, the first semiconductor wafer 110 will be stacked on top of the second semiconductor wafer 210. The first semiconductor wafer 110 and the second semiconductor wafer 210 are bonded together through suitable bonding techniques such as direct bonding, which may include oxide-to-oxide bonding, for example. In accordance with some embodiments, in a direct bonding process, the surface layers of semiconductor wafers 110 and 210 are oxide layers (for example, silicon oxide), which are bonded to each other through fusion bonding.

Figure 2:
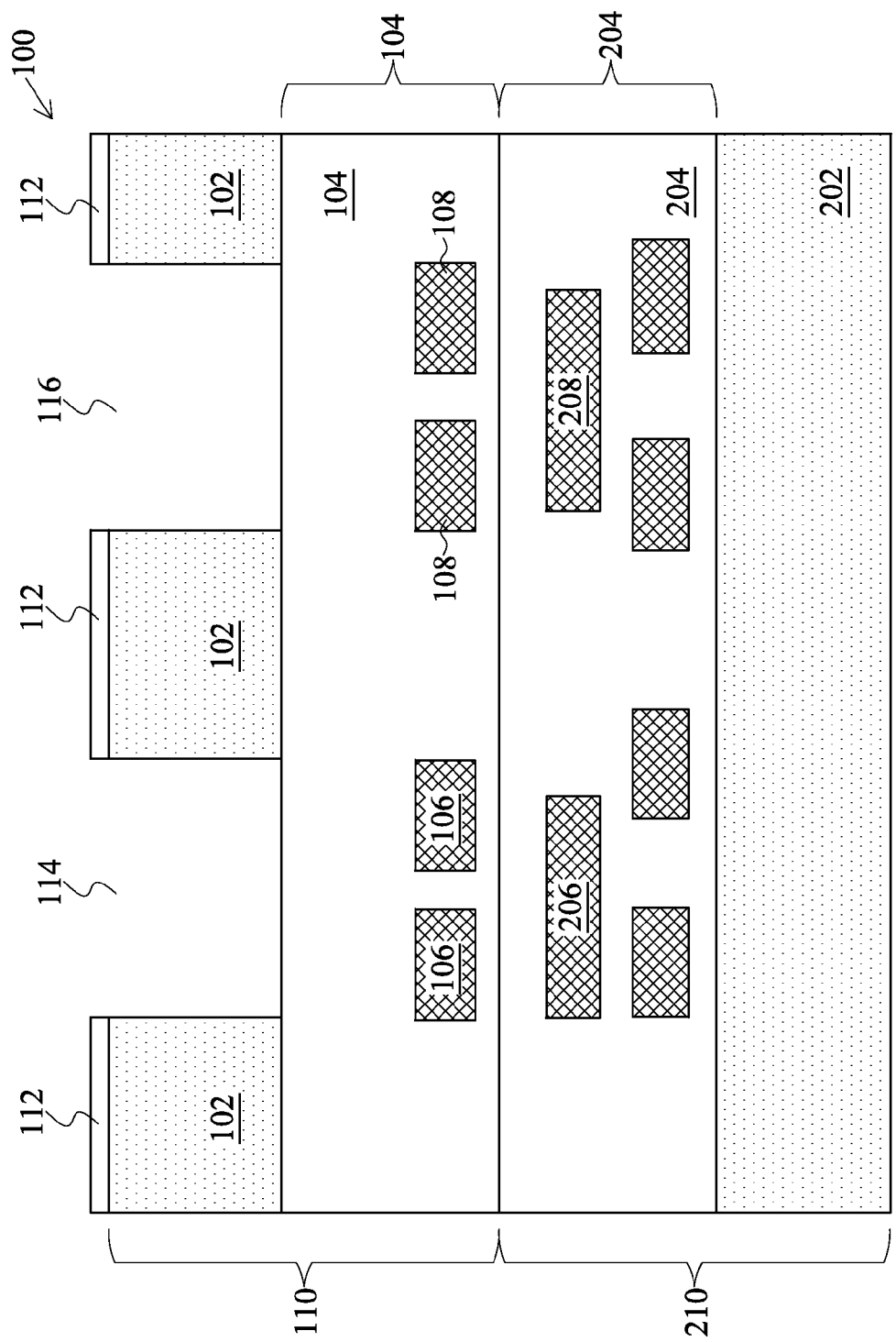

FIG. 2 illustrates a cross-sectional view of the semiconductor device shown in FIG. 1 after a bottom anti-reflection coating (BARC) layer is formed over the first semiconductor wafer and a patterning process is applied to the substrate of the first semiconductor wafer in accordance with various embodiments of the present disclosure. The BARC layer 112 is formed on the backside of the first substrate 102. Throughout the description, the side of the first substrate 102 adjacent to the BARC layer 112 is referred to the backside of the first substrate 102. The BARC layer 112 may be formed of a nitride material, an organic material, an oxide material and the like. The BARC layer 112 may be formed using suitable techniques such as chemical vapor deposition (CVD) and/or the like.

A patterned mask such as a photo resist mask may be formed over the BARC layer 112 using suitable deposition and photolithography techniques. A suitable etching process, such as a Reactive Ion Etch (RIE) or other dry etch, an anisotropic wet etch, or any other suitable anisotropic etch or patterning process may be applied to the first substrate 102 of the first semiconductor wafer 110. As a result, a plurality of through openings 114 and 116 are formed in the first substrate 102.

Figure 3:
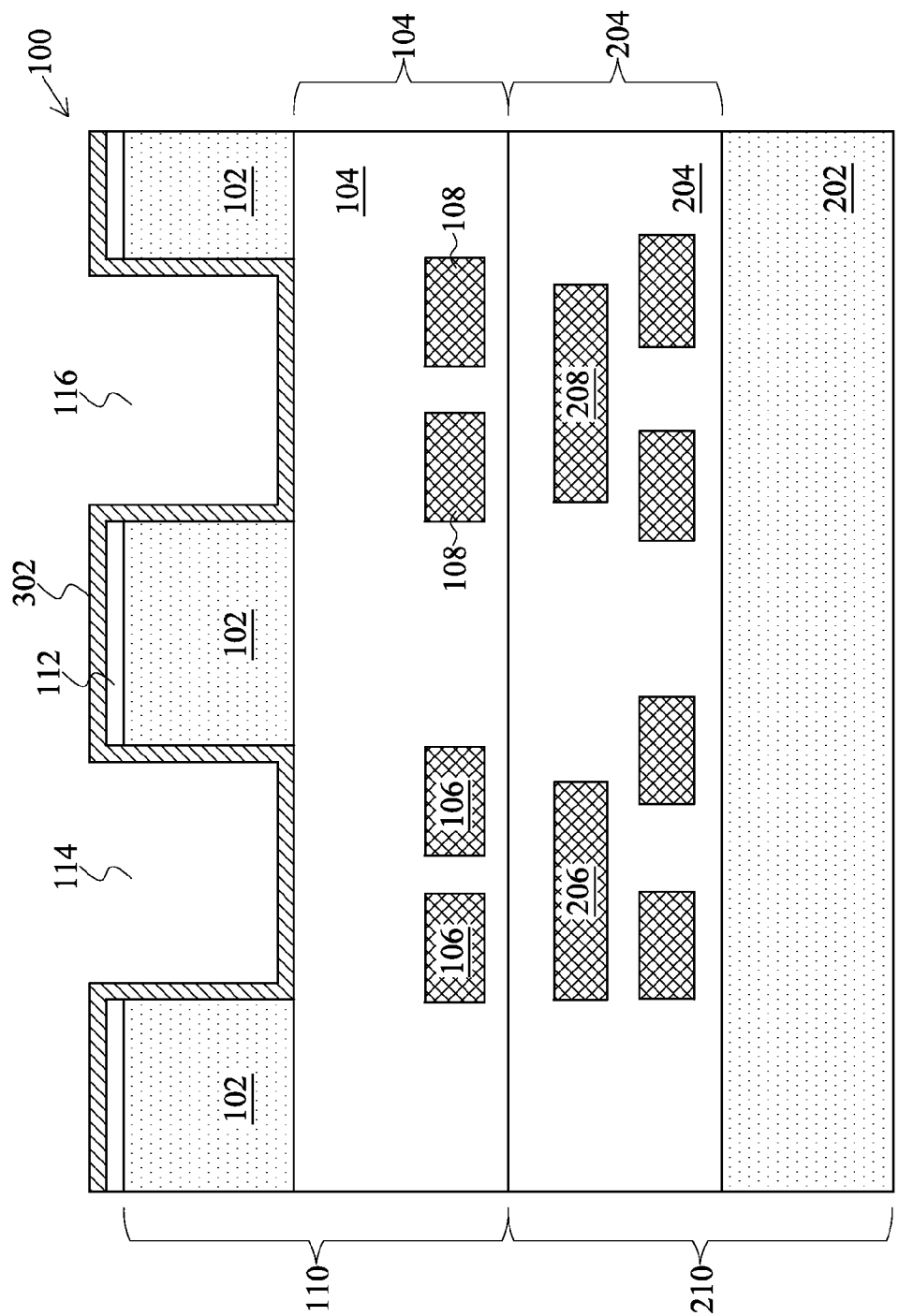

FIG. 3 illustrates a cross-sectional view of the semiconductor device shown in FIG. 2 after a dielectric layer is deposited over the semiconductor device in accordance with various embodiments of the present disclosure. As shown in FIG. 3, a dielectric layer 302 is formed on the bottoms and sidewalls of the openings 114 and 116. In addition, the dielectric layer 302 is formed over the BARC layer 112.

The dielectric layer 302 may be formed of various dielectric materials that can be used in integrated circuit fabrication. For example, the dielectric layer 302 may be formed of silicon dioxide, silicon nitride, silicon oxynitride, silicon carbide, or the like. In addition, a combination of the foregoing dielectric materials may also be used to form the dielectric layer 302. In accordance with some embodiments, the dielectric layer 302 may be formed using suitable techniques such as a Chemical Vapor Deposition (CVD) method.

Figure 4:
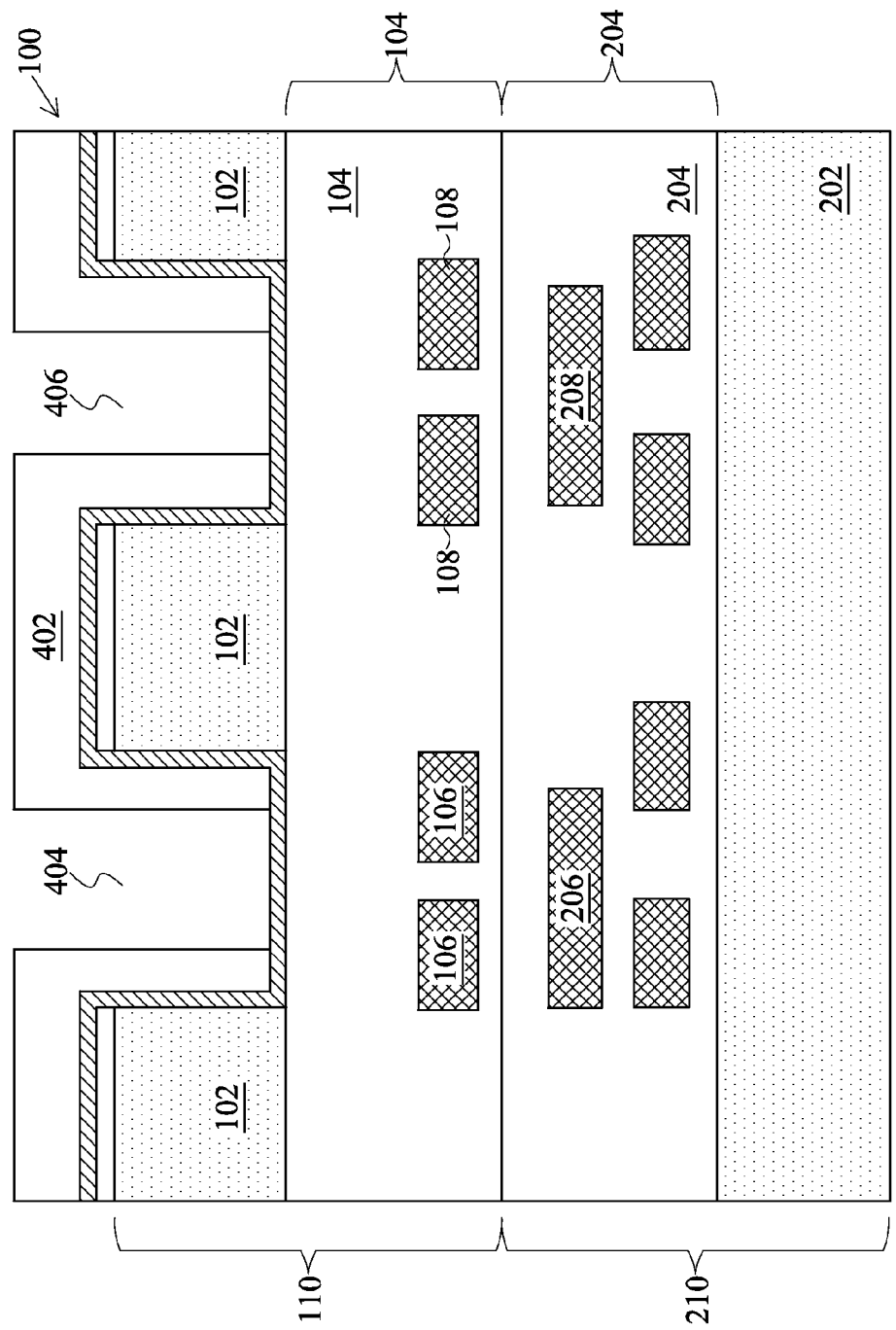

FIG. 4 illustrates a cross-sectional view of the semiconductor device shown in FIG. 3 after a mask layer is formed over the semiconductor device in accordance with various embodiments of the present disclosure. A patterned mask 402 is formed on the sidewalls of the openings 114 and 116 (shown in FIG. 3). As shown in FIG. 4, two new openings 404 and 406 are formed after the patterned mask 402 are formed along the sidewalls of the openings 114 and 116. The patterned mask 402 may be a photo resist layer. The patterned mask 402 is formed on the top surface of the semiconductor device using suitable deposition and photolithography techniques.

Figure 5:
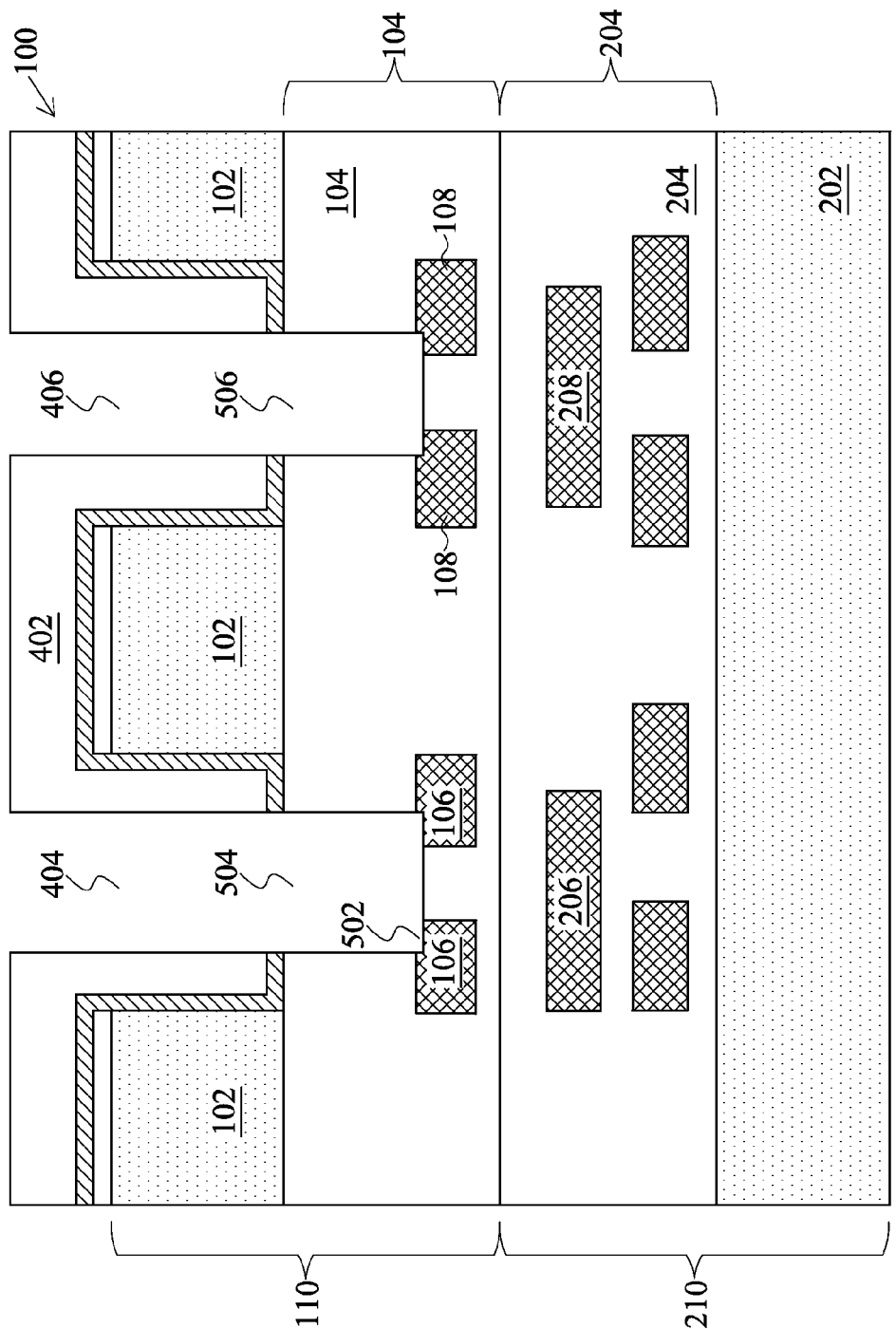

FIG. 5 illustrates a cross-sectional view of the semiconductor device shown in FIG. 4 after an etching process is applied to the semiconductor device in accordance with various embodiments of the present disclosure. A suitable etching process, such as a dry etch, an anisotropic wet etch, or any other suitable anisotropic etch or patterning process, may be performed to form openings 504 and 506. The openings 504 and 506 are respective extensions of the openings 404 and 406. As shown in FIG. 5, the etching is stopped when the metal pad 106 is exposed.

In some embodiments, as shown in FIG. 5, the metal pad 106 is used to determine when the etching should be stop. The etching is stopped when metal pad 106 is exposed, but not etched through. In some embodiments, metal pad 106 is partially etched away, thereby forming a recess such as recess 502. In the etching of metal pad 106, the metal atoms in metal pad 106 may be sputtered to the sidewalls of dielectric layers 104. Hence, the depth of the recess 502 is controlled to be as small as possible to reduce the undesirable sputter of metal atoms onto the sidewalls of dielectric layers 104.

Figure 6:
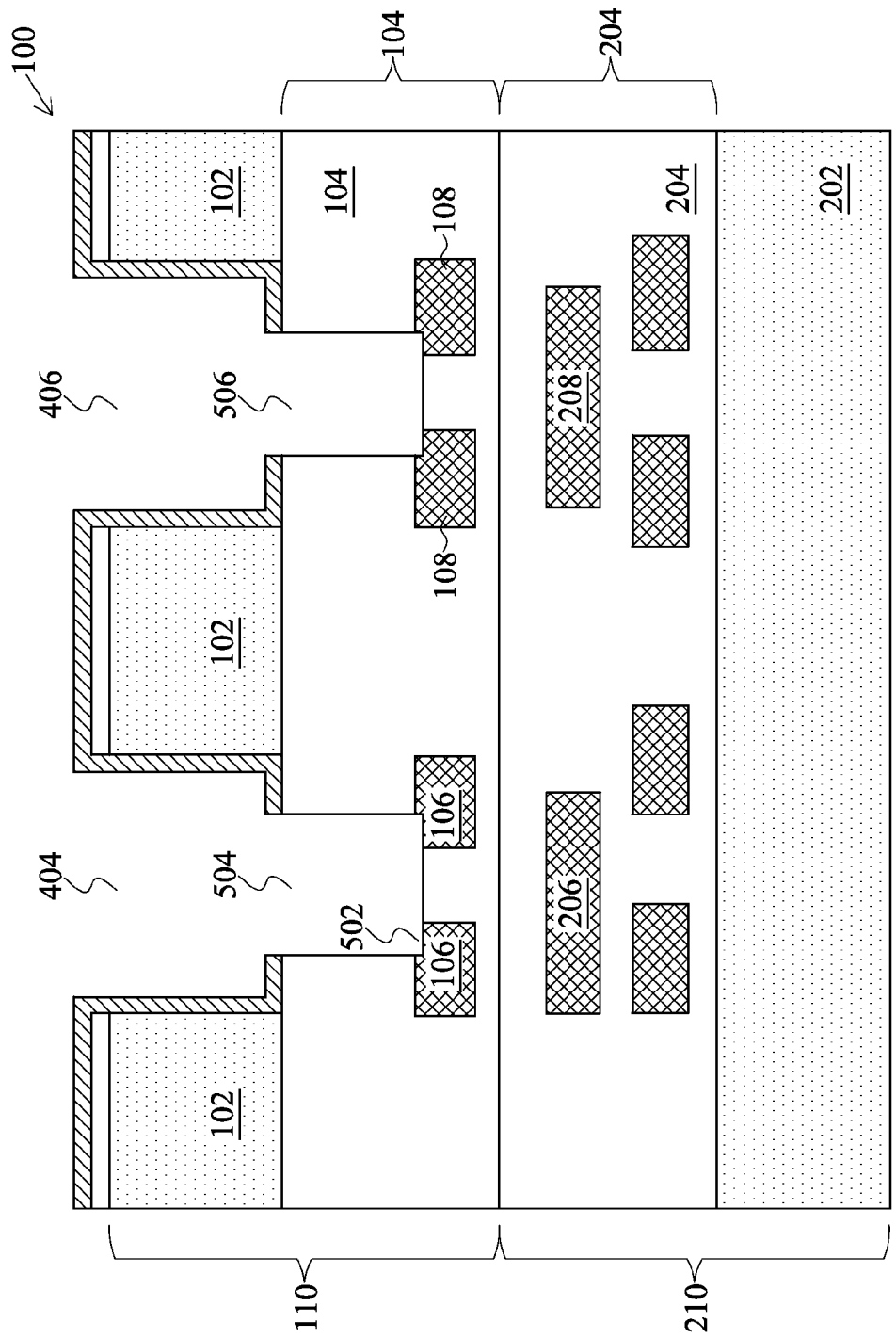

FIG. 6 illustrates a cross-sectional view of the semiconductor device shown in FIG. 5 after the remaining photo resist layer 402 has been removed in accordance with various embodiments of the present disclosure. The remaining photo resist layer 402 shown in FIG. 5 may be removed by using suitable photo resist stripping techniques such as chemical solvent cleaning, plasma ashing, dry stripping and/or the like.

Figure 7:
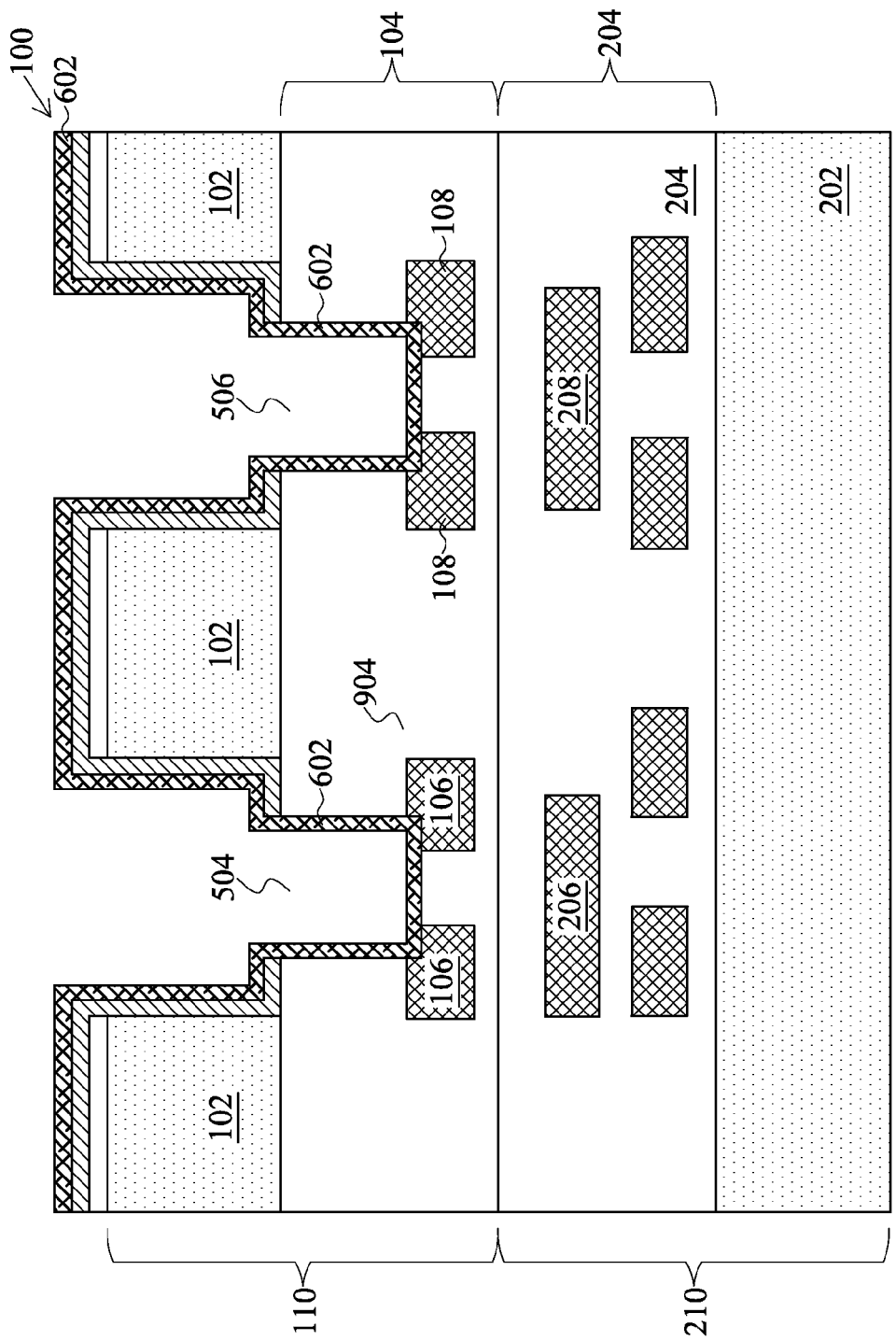

Referring to FIG. 7, dielectric layer 602 is formed on the bottoms and sidewalls of openings 404 and 504, and may be formed over dielectric layer 302. The dielectric layer 302 may be formed of silicon dioxide, silicon nitride, silicon oxynitride, silicon carbide, or the like. In addition, a combination of the foregoing dielectric materials may also be used to form the dielectric layer 302. In accordance with some embodiments, the dielectric layer 602 may be formed using suitable techniques such as Plasma Enhanced CVD (PECVD), High-Density Plasma CVD (HDPCVD), Low-Pressure CVD (LPCVD), and/or the like. Dielectric layers 302 and 602 may be formed of the same dielectric material, or different dielectric materials.

Figure 8:
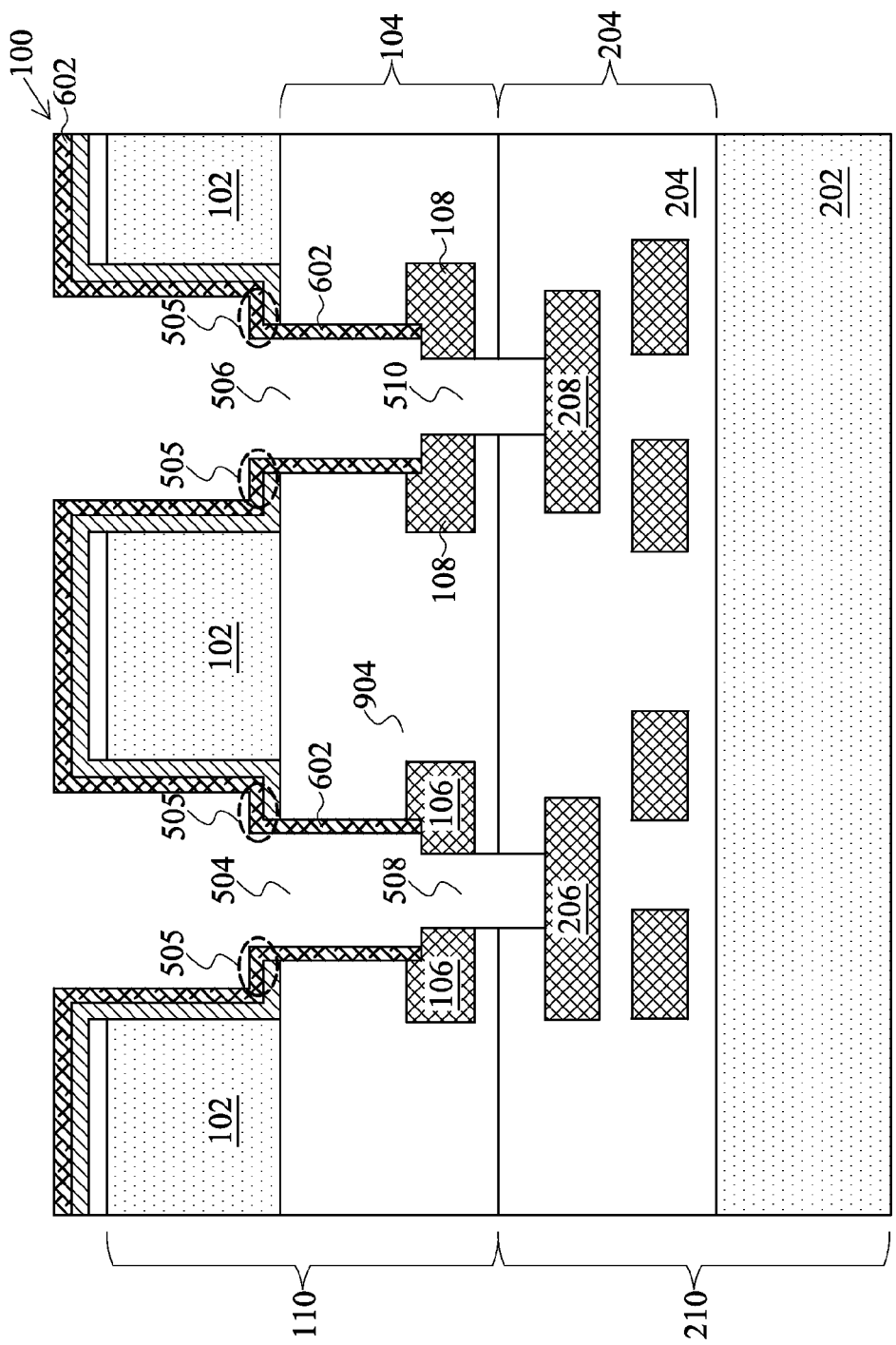

Referring to FIG. 8, a further anisotropic etching is performed to extend openings 504 and 506 down. Openings 508 and 510 are hence formed. In the etching process, an etchant gas that attacks dielectric layer 602, but not metal pad 106 is used. Hence, metal pad 106 acts as a hard mask layer (and hence metal pad 106 is also referred to as hard mask layer 106 hereinafter) in the etching process. In some embodiments, the anisotropic etching is performed with no additional etching mask formed. In these embodiments, the horizontal portions 505 of dielectric layer 602 may also be removed in the etching step. In alternative embodiments, an additional mask (not shown) may be formed for the etching process, and hence horizontal portions 505 may remain.

The etching continues to extend openings 508 and 510 into dielectric layers 204 of wafer 210. The etching is concluded when metal pads 206 and 208 are exposed. Advantageously, since dielectric layer 602 is formed on the sidewalls of openings 504 and 506, during the etching for forming openings 508 and 510, the undesirably metal ions sputtered from metal pads 106 and 108 will be deposited on the sidewalls of dielectric layer 602, rather than in contact with the dielectric material (which may be a low-k dielectric material) of dielectric layers 104, and hence the performance of dielectric layers 104 is not adversely affected.

Figure 9:
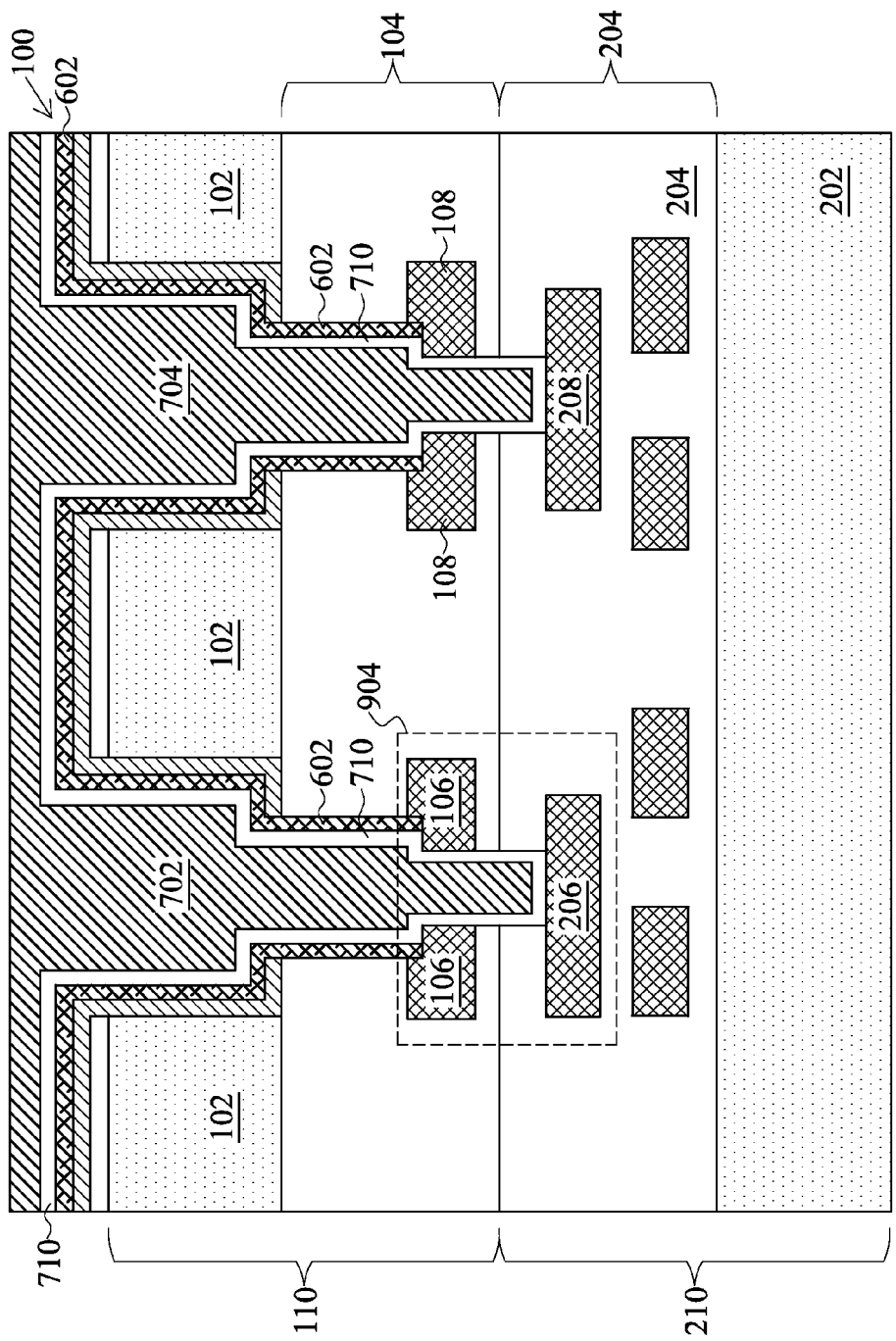

FIG. 9 illustrates a cross-sectional view after a conductive material has been filled in the openings in accordance with various embodiments of the present disclosure. In some embodiments, a conductive barrier layer 710 is deposited on the bottom as well as the sidewalls of the opening (e.g., opening 504, 506, 508, and 510 in FIG. 8). The barrier layer 710 may be formed of titanium, titanium nitride, tantalum, tantalum nitride, and combinations thereof and/or the like. In some embodiments, the barrier layer 710 may be uniform in thickness. In alternative embodiments, the barrier layer 710 may be non-uniform in thickness. The barrier layer 710 may be formed using suitable fabrication techniques such as Atomic Layer Deposition (ALD), PECVD, plasma enhanced physical vapor deposition (PEPVD) and/or the like.

In addition, a seed layer (not shown) may be deposited over the barrier layer 710. The seed layer may be formed of copper, nickel, gold, any combination thereof and/or the like. The seed layer may be formed by suitable deposition techniques such as PVD, CVD and/or the like.

Once the barrier layer 710 and the seed layer has been deposited in the openings, a conductive material, which includes tungsten, titanium, aluminum, copper, combinations thereof and/or the like, is filled into the remaining openings, forming conductive plugs 702 and 704. In some embodiments, the conductive material may be filled in the openings through an electroplating process.

Figure 10:
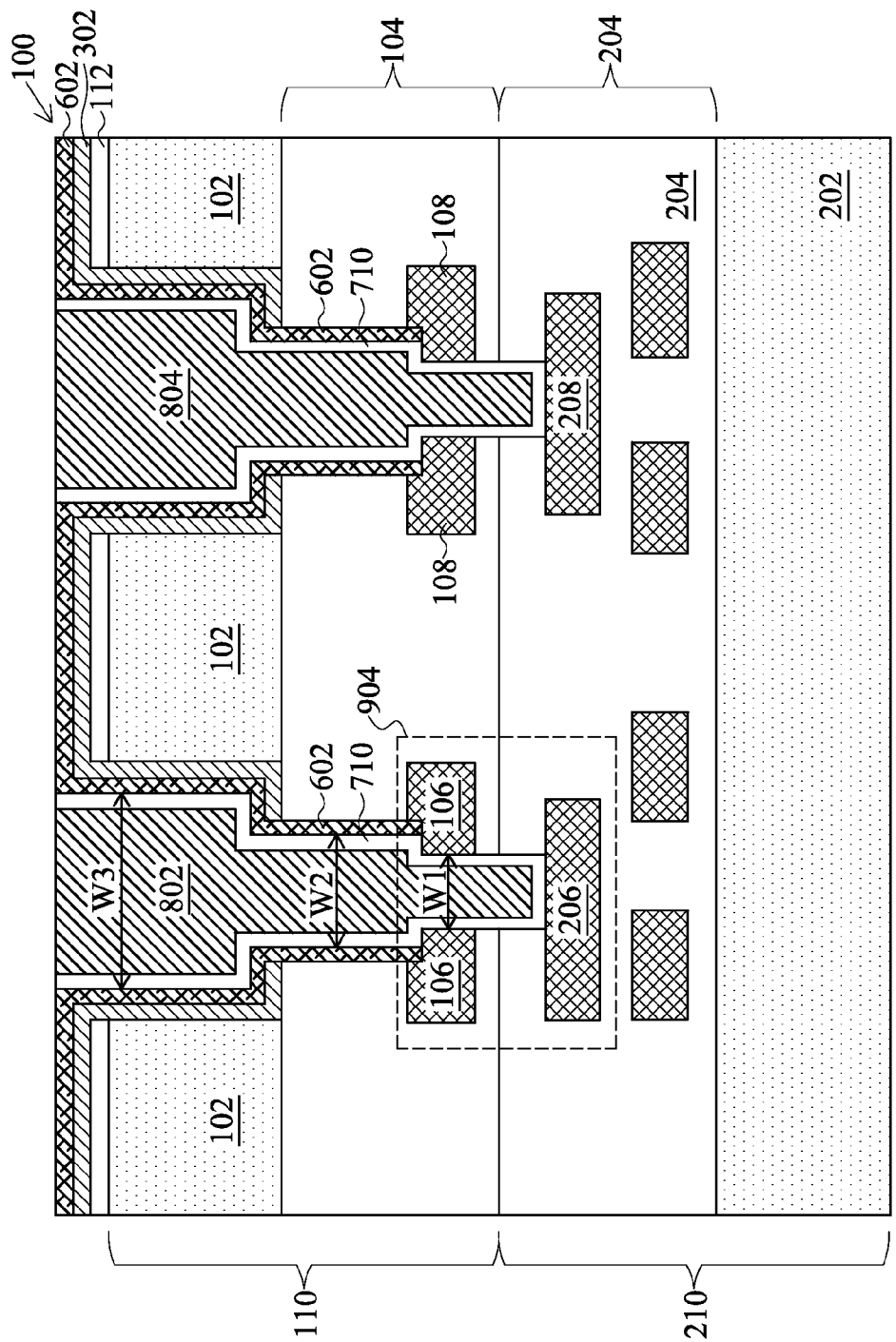

FIG. 10 illustrates a cross-sectional view of the semiconductor device shown in FIG. 9 after a chemical mechanical polish (CMP) process is applied to the top surface of the semiconductor device in accordance with various embodiments of the present disclosure. A planarization process such as CMP is performed to planarize the top surface of the semiconductor device. During the CMP, dielectric layer 602 may be used as a CMP stop layer. As shown in FIG. 10, two conductive plugs 802 and 804 are formed in the semiconductor device after the CMP process is performed. Conductive plugs 802 and 804 comprise 702 and 704 and the respective encircling conductive barrier 710. Conductive plug 802 electrically interconnects metal pad 106 and metal line 206, and conductive plug 804 electrically interconnects metal pad 108 and metal line 208.

As also shown in FIG. 10, each conductive plug (e.g., conductive plugs 802 and 804) comprises three portions. The first portion extends from the metal line 206 to metal pad 106. The first portion is of a width W1 as shown in FIG. 10. The second portion is from metal pad 106 to the front side of the first substrate 102. The second portion is of a width W2 as shown in FIG. 10. The third portion extends from the frontside of the first substrate 102 to the backside of the first substrate 102. The third portion is of a width W3 as shown in FIG. 10. In some embodiments, W2 is greater than or equal to W1. W3 is greater than W2.

Figure 11:
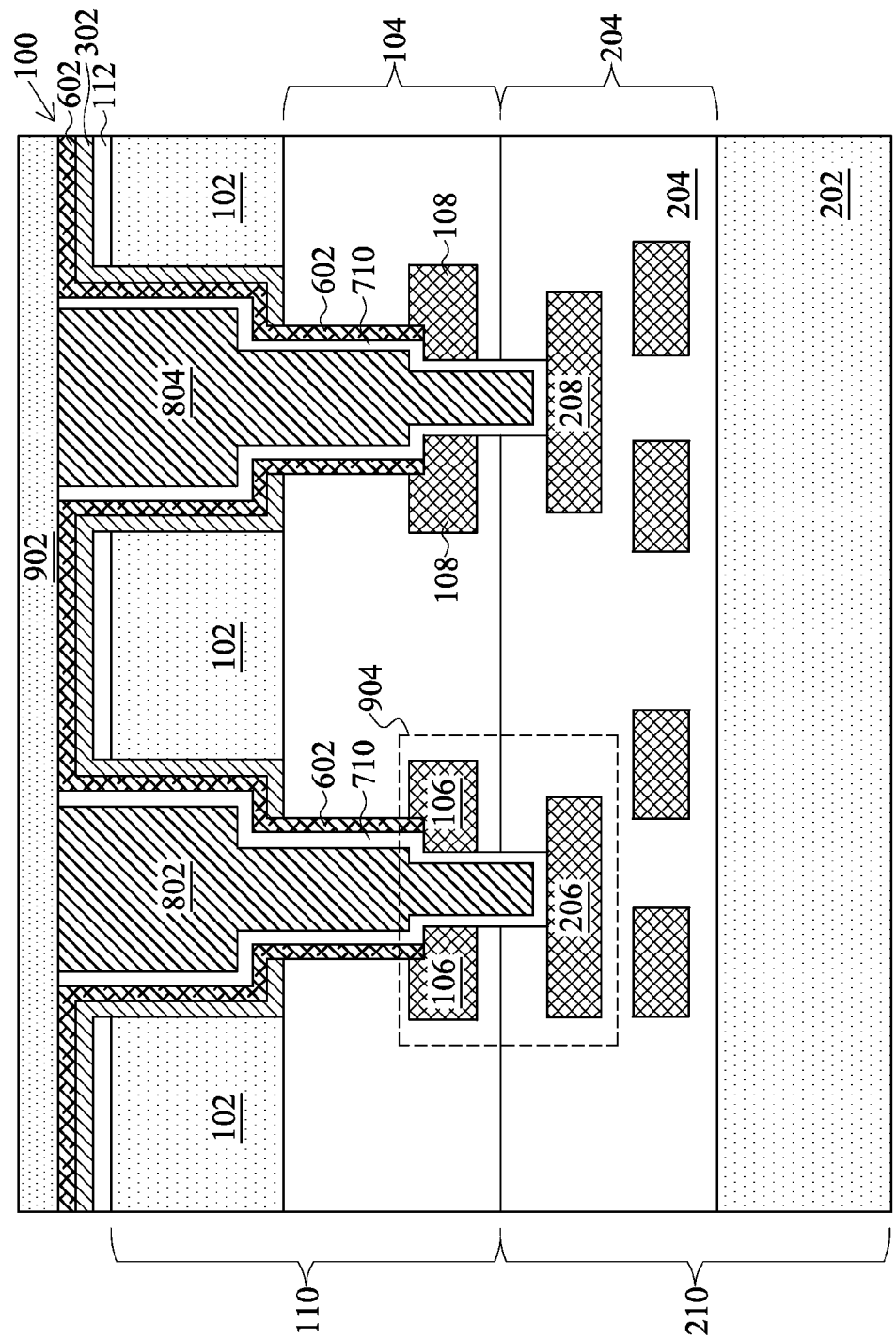

FIG. 11 illustrates a cross-sectional view of the semiconductor device shown in FIG. 10 after a dielectric layer is formed on the semiconductor device in accordance with various embodiments of the present disclosure. The dielectric layer 902 may comprise commonly used dielectric materials, such as silicon nitride, silicon oxynitride, silicon oxycarbide, silicon carbide, combinations thereof, and multi-layers thereof. The dielectric layer 902 may be deposited over the semiconductor device through suitable deposition techniques such as a CVD method. In subsequent steps, the bonded wafers 110 and 210 are sawed into a plurality of packages, with each of the packages including a chip from wafer 110 and a chip from wafer 210.

In the final structure in accordance with some embodiments, the entireties of the top surfaces of contact plugs 802 and 804 are in contact with dielectric layer 902. Accordingly, when the respective package is powered on, no current flows through the portions of contact plugs 802 and 804 over metal pads 106 and 108. In alternative embodiments, electrically connections (not shown) are formed to penetrate through dielectric layer 902 to electrically connect to metal pads 106 and 108. In these embodiments, currents may also flow through the portions of contact plugs 802 and 804 over metal pads 106 and 108.

The conductive plugs (e.g., conductive plug 802) include three portions. The first portion is in substrate 102, which portion includes both dielectric layers 302 and 602 on the sidewalls. Hence, since contact plug 802 is spaced apart from substrate 102 by two dielectric layers, the increased distances result in the desirable reduction in the parasitic capacitance between contact plug 802 and substrate 102. The second portion is in dielectric layers 104, and the second portion includes dielectric layer 602 but not dielectric layer 302. The third portion is in metal pad 106 and below, which portion does not include either one of dielectric layers 302 and 602. Hence, contact plug 802 (and conductive barrier layer 710) is in physical contact with the sidewalls of some portions of dielectric layer 104 and 204, which portions are below metal pad 106. The portion from metal pad 106 to the metal line 206 is referred to as a three-dimensional structure 904 throughout the description.

One advantageous feature of the stacked wafer having the conductive plugs 802 and 804 shown in FIG. 11 is that the active circuits of both semiconductor wafers are connected to each other through a single conductive plug (e.g., conductive plug 802). Such a single conductive plug helps to further reduce form factor. Furthermore, in comparison to stacked semiconductor devices connected by multiple conductive plugs, the single conductive plug coupled between two semiconductor wafers shown in FIG. 11 helps to cut power consumption and prevent parasitic interference.

It should be noted that while FIG. 11 illustrates two semiconductor wafers stacked together, one skilled in the art will recognize that the stacked semiconductor device shown in FIG. 11 is merely an example. There may be many alternatives, variations, and modifications. For example, the stacked semiconductor device may accommodate more than two semiconductor wafers.

Figure 12:
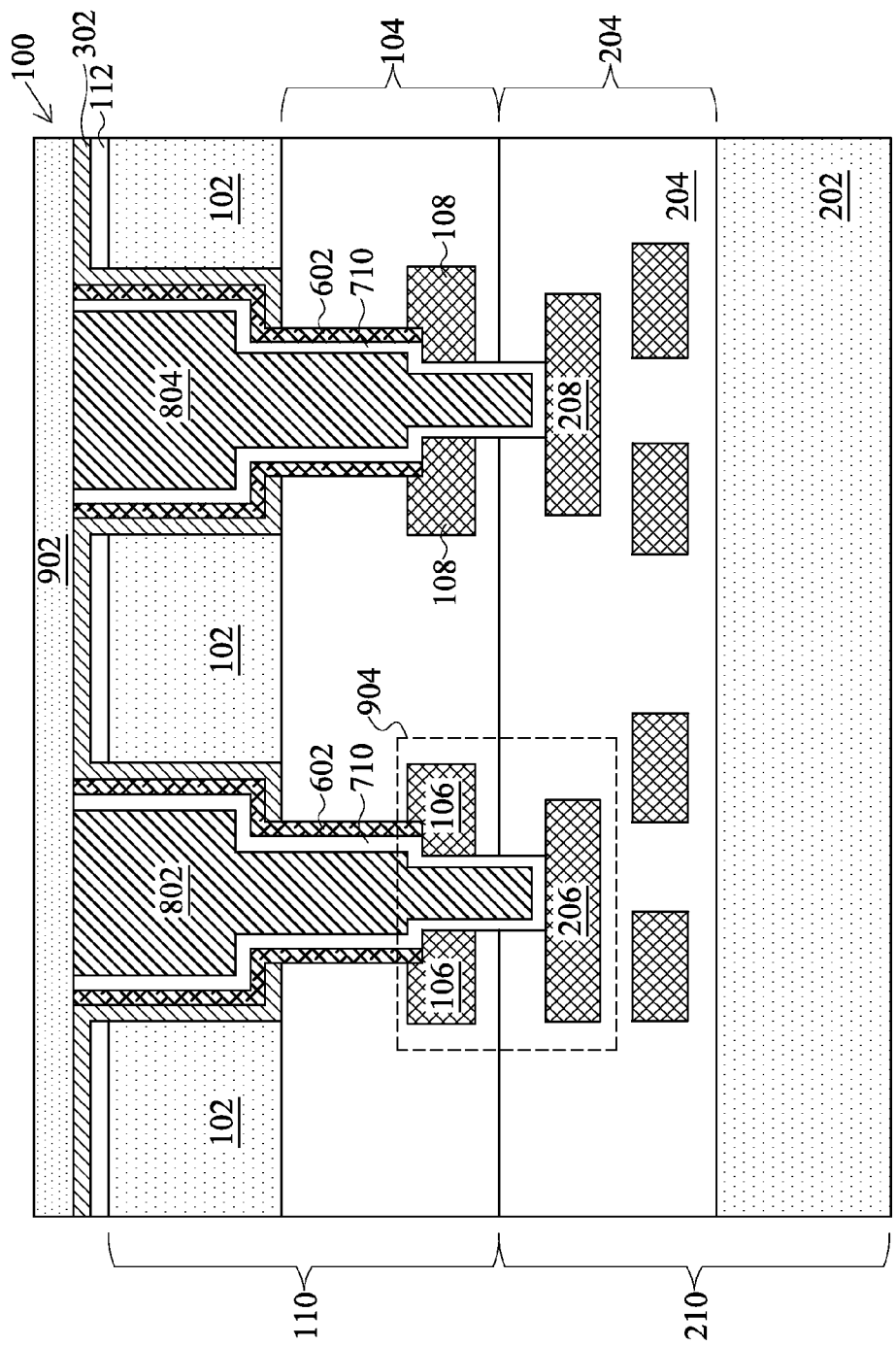
FIG. 12 illustrates a device including an interconnect structure connecting two dies in accordance with alternative embodiments, wherein a dielectric layer encircling contact plugs does not extend overlying the respective substrate.

FIG. 12 illustrates the cross-sectional view of the semiconductor device 100 in accordance with alternative embodiments. These embodiments are similar to the embodiments shown in FIG. 11, except that during the CMP as shown in FIG. 10, the portions of dielectric layer 602 over dielectric layer 302 is also polished, and hence in the resulting structure, dielectric layer 902 is in contact with dielectric layer 302. During the respective CMP, dielectric layer 302 is used as a CMP stop layer. When these embodiments are used in an image sensor application, removing the horizontal portion of dielectric layer 602 over substrate 102 advantageously eliminates its adverse effect to the incident light to the image sensor application.

Figure 13:
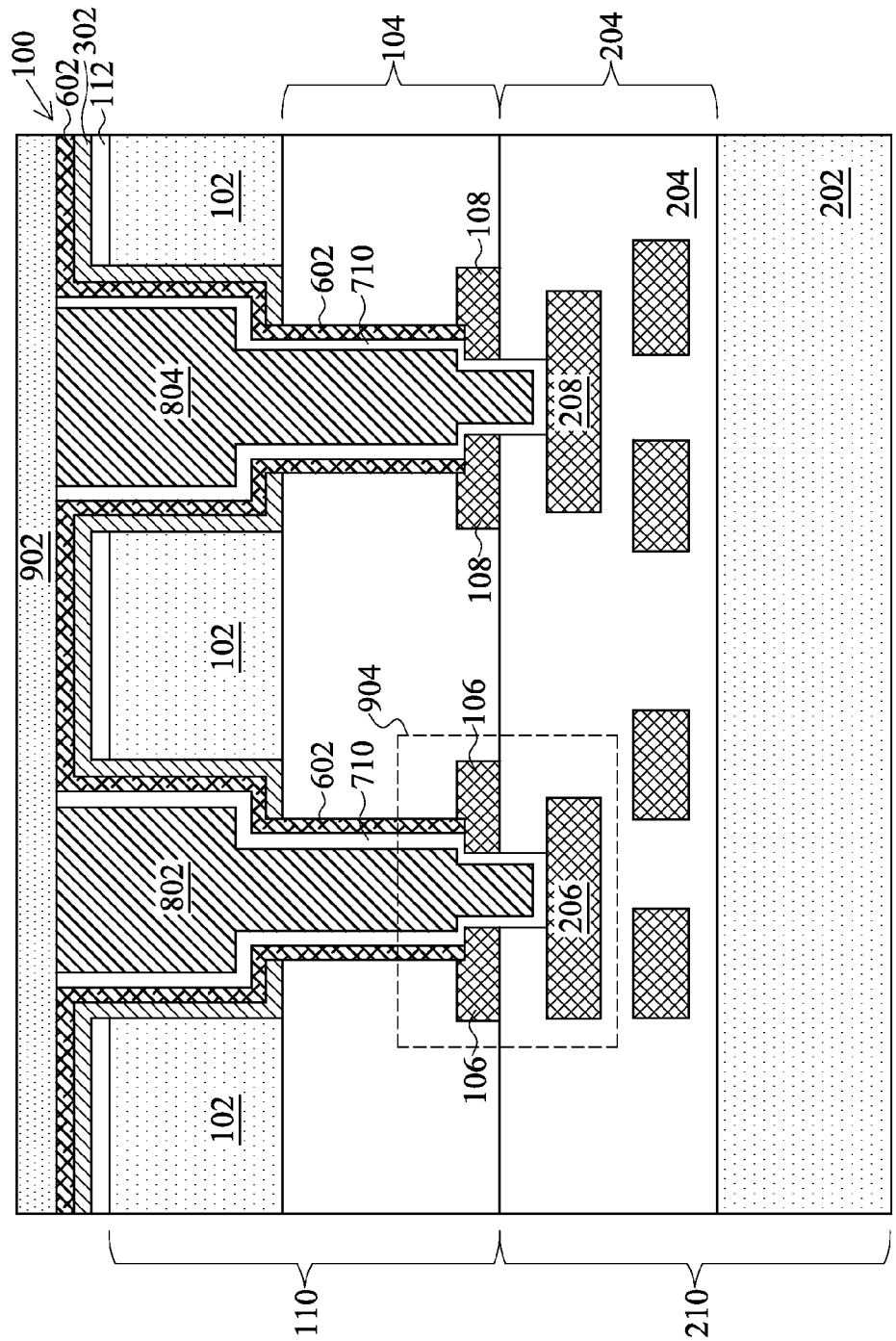
FIG. 13 illustrates a device including an interconnect structure connecting two dies in accordance with alternative embodiments, wherein a metal pad for the interconnect is at an interface between two bonded dies.
Figure 14:
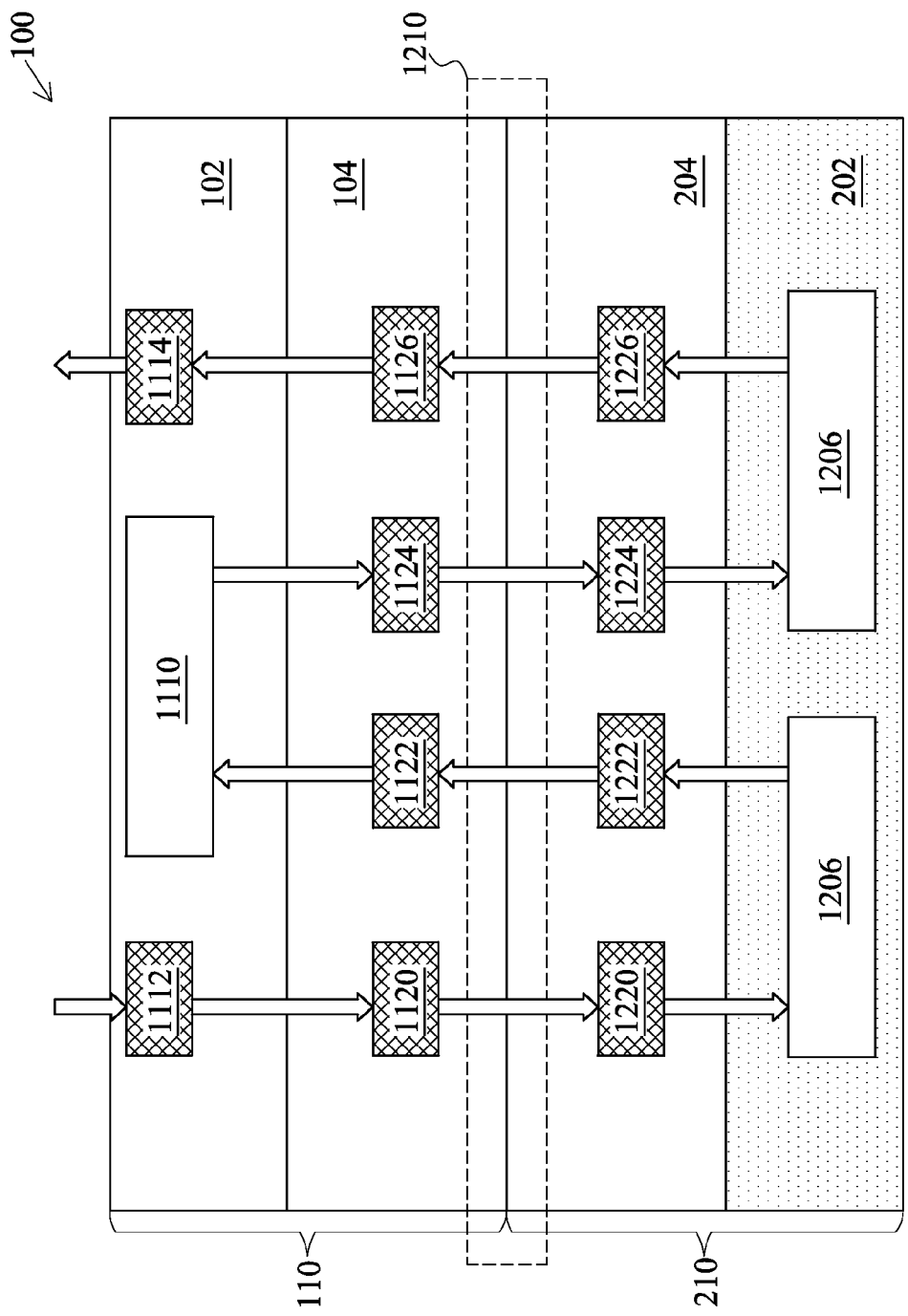
FIG. 14 illustrates a schematic view of a backside illuminated imager sensor including a stacked wafer structure in accordance with various embodiments of the present disclosure.

FIG. 13 illustrates a cross-sectional view of another stacked semiconductor device in accordance with various embodiments of the present disclosure. The stacked semiconductor device 100 is similar to the stacked semiconductor device 100 shown in FIG. 11 except that the metal pad 106 is located adjacent to the interface between the inter-metal dielectric layers 104 and 204. Accordingly, metal pad 106 is in contact with semiconductor wafer 210. In alternative embodiments, metal pad 106 may be in any other one of dielectric layers 104. FIG. 14 illustrates a cross-sectional view of an application of the packages as shown in FIGS. 11, 12, and 13. In these embodiments, the backside illuminated image sensor 100 comprises two semiconductor wafers, namely a sensor wafer 110 and an Application-Specific Integrated Circuit (ASIC) wafer 210. As shown in FIG. 14, the sensor wafer 110 is stacked on top of the ASIC 210. The sensor wafer 110 and the ASIC wafer 210 are electrically connected to each other.

The ASIC wafer 210 may comprise a plurality of logic circuits such as logic circuits 1206 and 1208. In some embodiments, the logic circuits may be an analog-to-digital converter. The logic circuits may also be other functional circuits that may be utilized within a backside illuminated image sensor. For example, the logic circuits 1206 and 1208 may be a data processing circuit, a memory circuit, a bias circuit, a reference circuit, any combinations thereof and/or the like.

The ASIC wafer 210 may further comprise a plurality of interconnection layers and a plurality of metal lines 1220, 1222, 1224 and 1226 (which represent and include metal pads 206 and 208 in FIGS. 11 through 13) embedded in the interconnection layers. The metal lines 1220, 1222, 1224 and 1226 may function as interconnection structures. As indicated by the arrows shown in FIG. 14, the metal lines 1220, 1222, 1224 and 1226 provide signal paths between logic circuits 1206 and 1208, and the sensor wafer 110.

The metal lines 1220, 1222, 1224 and 1226 may be made through any suitable formation process (e.g., lithography with etching, damascene, dual damascene, or the like) and may be formed using suitable conductive materials such as copper, aluminum, aluminum alloys, copper alloys or the like.

The sensor wafer 110 is fabricated by CMOS process techniques known in the art. In particular, the sensor wafer 110 comprises an epitaxial layer over a silicon substrate. According to the fabrication process of backside illuminated image sensors, the silicon substrate has been removed in a backside thinning process until the epitaxial layer is exposed. A portion of epitaxial layer may remain. A p-type photo active region and an n-type photo active region (not shown respectively) are formed in the remaining epitaxial layer.

The photo active regions such as the p-type photo active region and the n-type photo active region may form a PN junction, which functions as a photodiode. As shown in FIG. 14, the imager sensor 1110 may comprise a plurality of photodiodes.

The sensor wafer 110 may further comprise a transistor (not shown). In particular, the transistor may generate a signal related to the intensity or brightness of light that impinges on the photo active regions. In accordance with an embodiment, the transistor may be a transfer transistor. However, the transistor may be an example of the many types of functional transistors that may be utilized within a backside illuminated image sensor. For example, the transistor may include other transistors located within a backside illuminated image sensor, such as a reset transistor, a source follower transistor or a select transistor. All suitable transistors and configurations that may be utilized in an image sensor are fully intended to be included within the scope of the embodiments.

The sensor wafer 110 may comprise a plurality of interconnection layers and metal lines embedded in the interconnection layers. The metal lines 1120, 1122, 1124, and 1126 (which represent and include metal pads 106 and 108 in FIGS. 11 through 13) may provide signal paths between the sensor wafer 110 and the ASIC wafer 210. In particular, as indicated by the arrows shown in FIG. 14, an external signal may enter the backside illuminated image sensor 1200 through the aluminum copper pad 1112, and then reach the metal routing (e.g., metal line 1120) through interconnect structures such through vias (not shown). The external signal may further pass through a three-dimensional structure 1210. The three-dimensional structure 1210 may be the three-dimensional structure 904 shown in FIGS. 11 through 13.

After the external signal passes the three-dimensional structure 1210, the external signal may reach the logic circuit 1206 through the metal routing (e.g., metal line 1220) of the ASIC wafer 210. When a signal leaves the logic circuit 1206, it reaches the image sensor 1110 through a conductive path formed by the metal routing (e.g., metal line 1222) of the ASIC wafer 210, the three-dimensional structure 1210, and the metal routing (e.g., metal line 1122) of the sensor wafer 110.

After the image sensor 1110 generates a signal, the signal is sent to the logic circuit 1208 through a path formed by the metal routing (e.g., metal line 1124) of the sensor wafer 110, the three-dimensional structure 1210, and the metal routing (e.g., metal line 1224) of the ASIC wafer 210.

The logic circuit 1206 and 1208 may be coupled to aluminum copper pads 1112 and 1114. As shown in FIG. 12, the aluminum copper pads 1112 and 1114 may be formed on the backside of the sensor wafer 110.

It should be noted that the location of the aluminum copper pads 1112 and 1114 shown in FIG. 12 is merely an example. A person skilled in the art will recognize that there may be many alternatives, modifications and variations. For example, the aluminum copper pads 1112 and 1114 may be formed on the non-bonding side of the ASIC wafer 210. The form factor of a backside illuminated image sensor can be reduced by forming the aluminum copper pads 1112 and 1114 on the non-bonding side of the ASIC wafer 210.

One advantageous feature of having input/output terminals formed on the non-bonding side of the ASIC wafer 210 is that the density as well as quantum efficiency of the backside illuminated image sensor 1200 can be improved as a result.

Figure 15C:
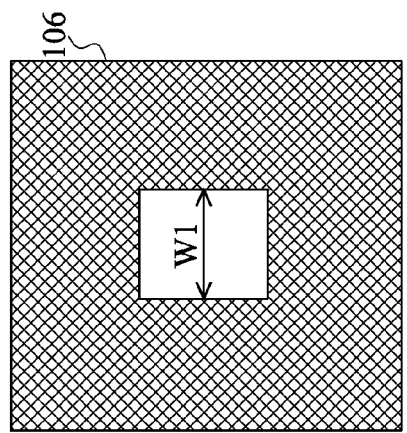
FIGS. 15A through 15D illustrate top views of various metal pads in accordance with various embodiments of the present disclosure, wherein the metal pads are used to form contact plugs.
Figure 15D:
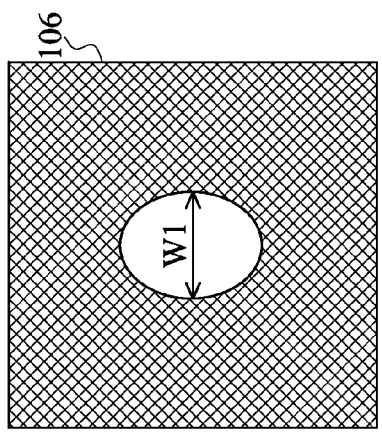
Figure 15A:
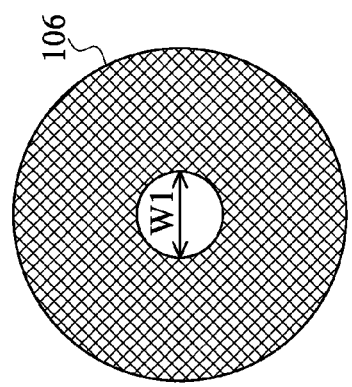
Figure 15B:
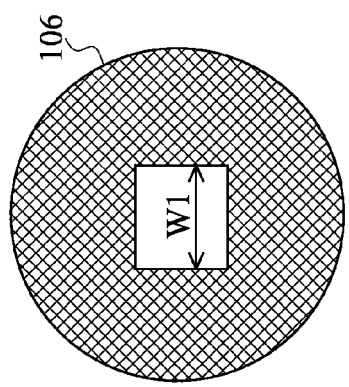

FIGS. 15A through 15D illustrate various top views of the hard mask in accordance with various embodiments of the present disclosure. FIG. 15A shows metal pad 106 is of a circular shape, with the inner edge and the outer edge both being circles. FIG. 15B illustrates that the outer edge of metal pad 106 has the shape of a circle, while the inner edge of metal pad 106 has the shape of a rectangle (such as a square). FIG. 15C shows metal pad 106 is of a ring shape, with the inner edge and the outer edge both being rectangles. FIG. 15D illustrates that the outer edge of metal pad 106 has the shape of a ring, while the inner edge of metal pad 106 has the shape of an ellipse, and the outer edge of metal pad 106 has the shape of a rectangle (such as a square).

The embodiments of the present disclosure have some advantageous features. By forming a dielectric layer after the metal pad is exposed, in the subsequent etching of the metal pad, the sputtered metal ions/atoms will not be in contact with the sidewalls of the inter-metal dielectric layers. The adverse effect caused by the mixing of the metal ions/atoms with the inter-metal dielectric layers is thus eliminated.

In accordance with some embodiments, an integrated circuit structure includes a first semiconductor chip including a first substrate, a first plurality of dielectric layers underlying the first substrate, and a first metal pad in one of the first plurality of dielectric layers. A second semiconductor chip includes a second substrate, a second plurality of dielectric layers over the second substrate and bonded to the first plurality of dielectric layers, and a second metal pad in one of the second plurality of dielectric layers. A conductive plug electrically couples the first metal pad to the second metal pad. The conductive plug includes a first portion extending from a top surface of the first substrate to a top surface of the first metal pad, and a second portion extending from the top surface of the first metal pad to a top surface of the second metal pad. An edge of the second portion is in physical contact with a sidewall of the first metal pad. A dielectric layer forms a ring encircling the first portion of the conductive plug, wherein the dielectric layer spaces the first portion of the conductive plug from the first plurality of dielectric layers.

In accordance with other embodiments, an integrated circuit structure includes a first semiconductor chip and a second semiconductor chip. The first semiconductor chip includes a first substrate, a first plurality of dielectric layers underlying the first substrate, and a first metal pad in one of the first plurality of dielectric layers. The second semiconductor chip includes a second substrate, a second plurality of dielectric layers overlying the second substrate, and a second metal pad in the second plurality of dielectric layers. A bottom layer of the first plurality dielectric layers is bonded to a top layer of the second plurality of dielectric layers. A conductive plug electrically couples the first metal pad to the second metal pad. The conductive plug includes a first portion penetrating through the first substrate, a second portion in the first plurality of dielectric layers, and a third portion extending into an opening in the first metal pad, with the opening encircled by the first metal pad. The third portion extends to a top surface of the second metal pad. A dielectric layer encircles the first portion and the second portion of the conductive plug, with an entirety of the first dielectric layer being higher than the top surface of the first metal pad.

In accordance with yet other embodiments, a method includes bonding a first chip to a second chip, wherein a first plurality of dielectric layers in the first chip has a bottom surface bonded to a top surface of a second plurality of dielectric layers in the second chip. A first through opening is formed in a first substrate in the first chip. A first dielectric layer is formed on a bottom and sidewalls of the first opening. The first dielectric layer and an upper portion of the first plurality of dielectric layers are etched to form a second opening, wherein a first metal pad in the first plurality of dielectric layers is exposed to the second opening. A second dielectric layer is formed on a bottom and sidewalls of the second opening. A bottom portion of the second dielectric layer in the second opening is etched, with sidewall portions of the second dielectric layer remaining. A third opening is formed to extend down from a top surface of the first metal pad to a second metal pad in the second chip, wherein the third opening is encircled by the first metal pad. The first opening, the second opening, and the third opening form a continuous opening. A conductive material is filled to form a conductive plug in the first opening, the second opening, and the third opening to form a contact plug, wherein the first metal pad is electrically connected to the second metal pad through the contact plug.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a first semiconductor chip including:
      a first substrate;
      a first plurality of dielectric layers underlying the first substrate; and
      a first metal pad in one of the first plurality of dielectric layers;
   a second semiconductor chip comprising:
      a second substrate;
      a second plurality of dielectric layers over the second substrate, wherein a bottom layer of the first dielectric layers is bonded to a top layer of the second plurality of dielectric layers; and
      a second metal pad in one of the second plurality of dielectric layers;
   a conductive plug electrically coupling the first metal pad to the second metal pad, wherein the conductive plug comprises:
      a first portion extending from a top surface of the first substrate to a top surface of the first metal pad; and
      a second portion extending from the top surface of the first metal pad to a top surface of the second metal pad, wherein an edge of the second portion is in physical contact with a sidewall of the first metal pad; and
   a first dielectric layer forming a ring encircling the first portion of the conductive plug, wherein the first dielectric layer spaces the first portion of the conductive plug from the first plurality of dielectric layers.

2. The integrated circuit structure of claim 1 further comprising:
   a second dielectric layer encircling the first dielectric layer, wherein the second dielectric layer has a top portion over the first substrate, and a bottom surface level with a bottom surface of the first substrate.

3. The integrated circuit structure of claim 1, wherein the first portion of the conductive plug further comprises:
   a first sub-portion in the first substrate; and
   a second sub-portion in the first plurality of dielectric layers, wherein the first sub-portion has a width equal to or greater than a width of the second sub-portion.

4. The integrated circuit structure of claim 1, wherein the first dielectric layer has a bottom surface contacting the top surface of the first metal pad.

5. The integrated circuit structure of claim 1, wherein the conductive plug continuous extends from the top surface of the first substrate to the top surface of the second metal pad.

6. The integrated circuit structure of claim 1, wherein the conductive plug comprises:

a conductive barrier extends from the top surface of the first substrate to the top surface of the second metal pad; and
a filling metal encircled by the conductive barrier.

7. The integrated circuit structure of claim 1, wherein the first semiconductor chip comprises an image sensor, and wherein the second semiconductor chip comprises an Application-Specific Integrated Circuit (ASIC).

8. An integrated circuit structure comprising:
a first semiconductor chip including:
a first substrate;
a first plurality of dielectric layers underlying the first substrate; and
a first metal pad in one of the first plurality of dielectric layers;
a second semiconductor chip comprising:
a second substrate;
a second plurality of dielectric layers overlying the second substrate, wherein a bottom layer of the first plurality dielectric layers is bonded to a top layer of the second plurality of dielectric layers; and
a second metal pad in the second plurality of dielectric layers;
a conductive plug electrically coupling the first metal pad to the second metal pad, wherein the conductive plug comprises:
a first portion penetrating through the first substrate;
a second portion in the first plurality of dielectric layers; and
a third portion extending into an opening in the first metal pad, with the opening encircled by the first metal pad, wherein the third portion extends to a top surface of the second metal pad; and
a first dielectric layer encircling the first portion and the second portion of the conductive plug, with an entirety of the first dielectric layer being higher than the top surface of the first metal pad.

9. The integrated circuit structure of claim 8 further comprising:
a second dielectric layer encircling the first dielectric layer, wherein an entirety of the second dielectric layer is substantially higher than a bottom surface of the first substrate.

10. The integrated circuit structure of claim 9, wherein the second dielectric layer further comprises an additional portion overlapping the first substrate.

11. The integrated circuit structure of claim 9, wherein the second dielectric layer further comprises a portion extending under outer parts of the second portion of the conductive plug.

12. The integrated circuit structure of claim 8, wherein the first dielectric layer further comprises a portion extending under outer parts of the first portion of the conductive plug.

13. The integrated circuit structure of claim 8, wherein the first dielectric layer further comprises an additional portion overlapping the first substrate.

14. The integrated circuit structure of claim 8, wherein the first semiconductor chip comprises an image sensor, and wherein the second semiconductor chip comprises an Application-Specific Integrated Circuit (ASIC).

15. A method comprising:
bonding a first chip to a second chip, wherein a first plurality of dielectric layers in the first chip has a bottom surface bonded to a top surface of a second plurality of dielectric layers in the second chip;
forming a first through opening in a first substrate in the first chip;
forming a first dielectric layer on a bottom and sidewalls of the first opening;
etching the first dielectric layer and an upper portion of the first plurality of dielectric layers to form a second opening, wherein a first metal pad in the first plurality of dielectric layers is exposed to the second opening;
forming a second dielectric layer on a bottom and sidewalls of the second opening;
etching a bottom portion of the second dielectric layer in the second opening, with sidewall portions of the second dielectric layer remaining;
forming a third opening extending down from a top surface of the first metal pad to a second metal pad in the second chip, wherein the third opening is encircled by the first metal pad, and wherein the first opening, the second opening, and the third opening form a continuous opening; and
filling a conductive material to form a conductive plug in the first opening, the second opening, and the third opening to form a contact plug, wherein the first metal pad is electrically connected to the second metal pad through the contact plug.

16. The method of claim 15 further comprising:
forming a third dielectric layer over the conductive plug; and
sawing the first chip and the second chip from respective wafers, wherein after the step of sawing, an entirety a top surface of the conductive plug is in contact with the third dielectric layer, with no conductive features penetrating through the third dielectric layer to connect to the conductive plug.

17. The method of claim 15, wherein the conductive plug comprises:
a conductive barrier layer, wherein the conductive barrier layer is in physical contact with an inner edge of the first metal pad; and
a filling metal encircled by the conductive barrier layer.

18. The method of claim 15, wherein the forming the conductive plug comprises performing a Chemical Mechanical Polish (CMP) on the conductive material, and wherein during the CMP, the first dielectric layer is used a CMP stop layer.

19. The method of claim 15, wherein the forming the conductive plug comprises performing a Chemical Mechanical Polish (CMP) on the conductive material, wherein during the CMP, the second dielectric layer is used a CMP stop layer.

20. The method of claim 15, wherein the first chip is a image sensor chip comprising image sensors, with the first metal pad electrically coupled to the image sensors, and wherein the second chip comprises an Application-Specific Integrated Circuit (ASIC), with the second metal pad electrically coupled to the ASIC.

* * * * *